United States Patent
Ajima

(10) Patent No.: US 10,505,515 B2
(45) Date of Patent: Dec. 10, 2019

(54) LADDER FILTER

(71) Applicant: Murata Manufacturing Co., Ltd., Nagaokakyo-shi, Kyoto-fu (JP)

(72) Inventor: Daisuke Ajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 304 days.

(21) Appl. No.: 15/417,444

(22) Filed: Jan. 27, 2017

(65) Prior Publication Data

US 2017/0141758 A1 May 18, 2017

Related U.S. Application Data

(63) Continuation of application No. PCT/JP2015/067327, filed on Jun. 16, 2015.

(30) Foreign Application Priority Data

Jul. 28, 2014 (JP) .................. 2014-152620

(51) Int. Cl.
*H03H 9/64* (2006.01)
*H03H 9/05* (2006.01)
(Continued)

(52) U.S. Cl.
CPC ...... *H03H 9/6483* (2013.01); *H03H 9/02834* (2013.01); *H03H 9/02992* (2013.01);
(Continued)

(58) Field of Classification Search
CPC .......... H03H 9/02834; H03H 9/02992; H03H 9/02929; H03H 9/059; H03H 9/08;
(Continued)

(56) References Cited

U.S. PATENT DOCUMENTS 5,215,546 A * 6/1993 Cho .................. H03H 3/08
29/25.01
5,559,481 A 9/1996 Satoh et al.
(Continued)

FOREIGN PATENT DOCUMENTS

JP 02-078314 A * 3/1990
JP 05-183380 A 7/1993
(Continued)

OTHER PUBLICATIONS

English language machine translation of JP 2008-072771 A, published Mar. 27, 2008, 14 pages. (Year: 2008).*
(Continued)

*Primary Examiner* — Barbara Summons
(74) *Attorney, Agent, or Firm* — Keating & Bennett, LLP

(57) ABSTRACT

A ladder filter includes a piezoelectric substrate, an antenna terminal, a transmission terminal, and ground terminals on the piezoelectric substrate, and IDT electrodes. Each of the IDT electrodes is disposed on the piezoelectric substrate and includes a plurality of electrode fingers and a pair of busbars to which first ends of the plurality of electrode fingers are connected commonly. The IDT electrodes define elastic wave resonators. The ladder filter further includes an interlayer insulating film disposed on at least one of the busbars and a thermally conductive member made of a material with thermal conductivity higher than that of the interlayer insulating film and disposed on the interlayer insulating film. The thermally conductive member is in contact with at least one of the antenna terminal, the transmission terminal, and the ground terminals.

20 Claims, 8 Drawing Sheets

(51) Int. Cl.
*H03H 9/25* (2006.01)
*H03H 9/02* (2006.01)
*H03H 9/72* (2006.01)

(52) U.S. Cl.
CPC .............. *H03H 9/059* (2013.01); *H03H 9/25* (2013.01); *H03H 9/64* (2013.01); *H03H 9/725* (2013.01)

(58) Field of Classification Search
CPC .......... H03H 9/25; H03H 9/64; H03H 9/6483; H03H 9/725
USPC ......................................... 333/133, 193, 195
See application file for complete search history.

(56) References Cited

U.S. PATENT DOCUMENTS

| | | | | |
|---|---|---|---|---|
| 5,831,493 | A * | 11/1998 | Ushiroku | H03H 9/6483 333/193 |
| 8,183,958 | B2 * | 5/2012 | Fujita | H03H 9/0222 333/133 |
| 8,471,433 | B2 * | 6/2013 | Yamaji | H03H 9/1092 310/313 R |
| 8,502,621 | B2 * | 8/2013 | Uesaka | H03H 9/14547 333/133 |
| 2007/0278898 | A1 * | 12/2007 | Miura | H03H 9/0222 310/313 R |
| 2012/0098618 | A1 * | 4/2012 | Tanaka | H03H 9/6436 333/133 |
| 2014/0368296 | A1 * | 12/2014 | Nishizawa | H03H 9/725 333/133 |

FOREIGN PATENT DOCUMENTS

| | | | |
|---|---|---|---|
| JP | 2000-138553 A | | 5/2000 |
| JP | 2000-223989 A | * | 8/2000 |
| JP | 2000-261285 A | | 9/2000 |
| JP | 2008-005241 A | | 1/2008 |
| JP | 2008-072771 A | * | 3/2008 |
| JP | 2010-135959 A | | 6/2010 |
| JP | 2013-232992 A | | 11/2013 |
| WO | 2010/150882 A1 | | 12/2010 |

OTHER PUBLICATIONS

English language machine translation of JP 02-078314 A, published Mar. 19, 1990, 2 pages. (Year: 1990).*
English language machine translation of JP 2008-005241 A, published Jan. 10, 2008, 12 pages. (Year: 2008).*
Official Communication issued in corresponding International Application PCT/JP2015/067327, dated Aug. 25, 2015.

* cited by examiner

LADDER FILTER

CROSS REFERENCE TO RELATED APPLICATIONS

This application claims the benefit of priority to Japanese Patent Application No. 2014-152620 filed on Jul. 28, 2014 and is a Continuation application of PCT Application No. PCT/JP2015/067327 filed on Jun. 16, 2015. The entire contents of each application are hereby incorporated herein by reference.

BACKGROUND OF THE INVENTION

1. Field of the Invention

The present invention relates to a ladder filter preferably use in a wireless communication device.

2. Description of the Related Art

Ladder filters have been widely used in wireless communication devices and the like.

One example ladder filter is described in Japanese Unexamined Patent Application Publication No. 5-183380. In the ladder filter, an inductance is connected in series to a parallel arm resonator. This configuration is described as being capable of increasing the attenuation outside a pass band.

However, no consideration is given to a thermal dissipation path from an elastic wave resonator in the ladder filter described in Japanese Unexamined Patent Application Publication No. 5-183380. Accordingly, there is a problem that sufficient thermal dissipation is not obtainable. Because thermal dissipation from the ladder filter is insufficient, its electric power handling capability may degrade.

SUMMARY OF THE INVENTION

Preferred embodiments of the present invention provide a ladder filter with enhanced thermal dissipation.

A ladder filter according to a preferred embodiment of the present invention includes a piezoelectric substrate, a first signal terminal, a second signal terminal, and a ground terminal disposed on the piezoelectric substrate, and a plurality of interdigital transducer (IDT) electrodes disposed on the piezoelectric substrate, each of the IDT electrodes including a plurality of electrode fingers and a pair of busbars to which first ends of the plurality of electrode fingers are connected commonly. The plurality of IDT electrodes define a plurality of elastic wave resonators with a predetermined pass band, the plurality of elastic wave resonators include a plurality of series arm resonators and a parallel arm resonator. The plurality of series arm resonators are provided in a series arm connecting the first signal terminal and the second signal terminal. The parallel arm resonators are provided in a parallel arm connecting the series arm and the ground terminal. The ladder filter further includes an interlayer insulating film disposed on at least one of the busbars and a thermally conductive member made of a material possessing thermal conductivity higher than that of the interlayer insulating film and disposed on the interlayer insulating film. The thermally conductive member is in contact with at least one of the first signal terminal, the second signal terminal, and the ground terminal.

In a specific aspect of a ladder filter according to a preferred embodiment of the present invention, the thermally conductive member may be in contact with the ground terminal.

In another specific aspect of a ladder filter according to a preferred embodiment of the present invention, the thermally conductive member may possess electrical conductivity, and the thermally conductive member may be in contact with only the ground terminal among the first signal terminal, the second signal terminal, and the ground terminal.

In yet another specific aspect of a ladder filter according to a preferred embodiment of the present invention, the busbar, the interlayer insulating film, and the thermally conductive member may define a capacitor.

In still another specific aspect of a ladder filter according to a preferred embodiment of the present invention, the thermally conductive member may not possess electrical conductivity.

In another specific aspect of a ladder filter according to a preferred embodiment of the present invention, the plurality of elastic wave resonators may include an elastic wave resonator including the busbar on which the interlayer insulating film is disposed and an elastic wave resonator including the busbar on which the interlayer insulating film is not disposed, and power consumption of the elastic wave resonator including the busbar on which the interlayer insulating film is disposed may not be the lowest among the plurality of elastic wave resonators.

In another specific aspect of a ladder filter according to a preferred embodiment of the present invention, an area where the IDT electrodes in the elastic wave resonator including the busbar on which the interlayer insulating film is disposed are provided may not be the largest among the plurality of elastic wave resonators.

In yet another specific aspect of a ladder filter according to a preferred embodiment of the present invention, the plurality of series arm resonators may include the elastic wave resonator including the busbar on which the interlayer insulating film is disposed.

In still another specific aspect of a ladder filter according to a preferred embodiment of the present invention, the plurality of series arm resonators may include a series arm resonator including the busbar on which the interlayer insulating film is disposed and a series arm resonator including the busbar on which the interlayer insulating film is not disposed, and the series arm resonator including the busbar on which the interlayer insulating film is disposed may have an anti-resonant frequency nearest a frequency at an attenuation pole nearest the predetermined pass band on a higher frequency side outside the predetermined pass band.

In yet another specific aspect of a ladder filter according to a preferred embodiment of the present invention, the parallel arm resonators may include a parallel arm resonator including the busbar on which the interlayer insulating film is disposed and a parallel arm resonator including the busbar on which the interlayer insulating film is not disposed, and the parallel arm resonator including the busbar on which the interlayer insulating film is disposed may have a resonant frequency nearest a frequency at an attenuation pole arranged nearest the predetermined pass band on a lower frequency side outside the predetermined pass band.

In still another specific aspect of a ladder filter according to a preferred embodiment of the present invention, among the plurality of elastic wave resonators, two adjacent elastic wave resonators may include first busbars that are electrically connected to each other and that are not connected to the ground terminal, the interlayer insulating film may be disposed so as to reach both the first busbars, and the thermally conductive member may be disposed on the interlayer insulating film.

In yet another specific aspect of a ladder filter according to a preferred embodiment of the present invention, the IDT electrodes may include an electrode finger overlap portion, and the interlayer insulating film may reach a region between the electrode finger overlap portion and the busbar.

According to various preferred embodiments of the present invention, ladder filters with enhanced thermal dissipation are provided.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

The present invention is clarified below by describing concrete preferred embodiments of the present invention with reference to the drawings.

Figure 1:
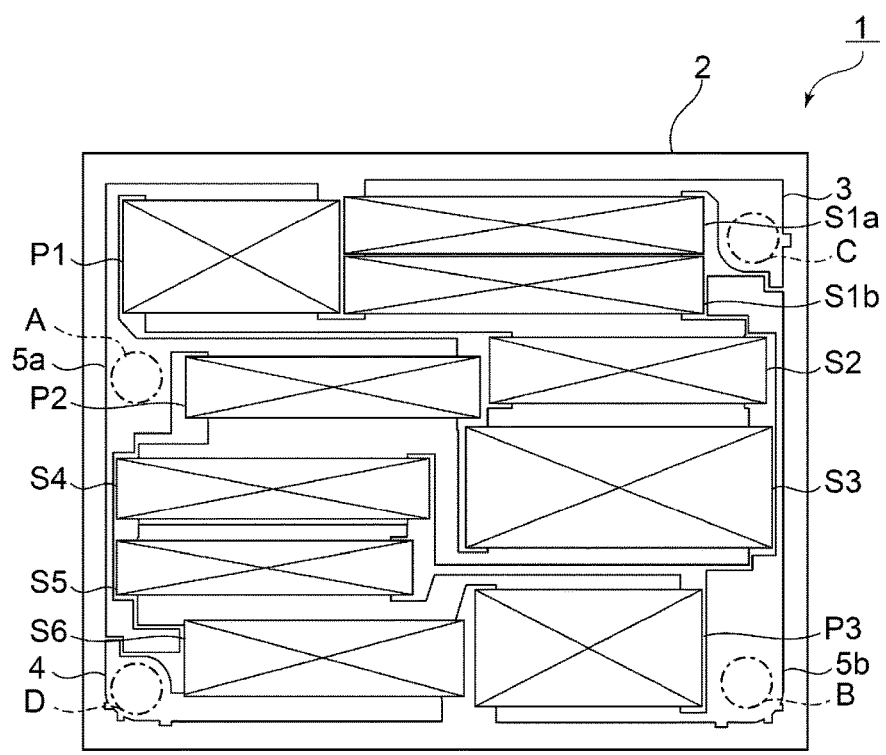
FIG. 1 is a schematic plan view that illustrates a state where a first conductive layer is disposed on a piezoelectric substrate in a first preferred embodiment of the present invention.
Figure 2:
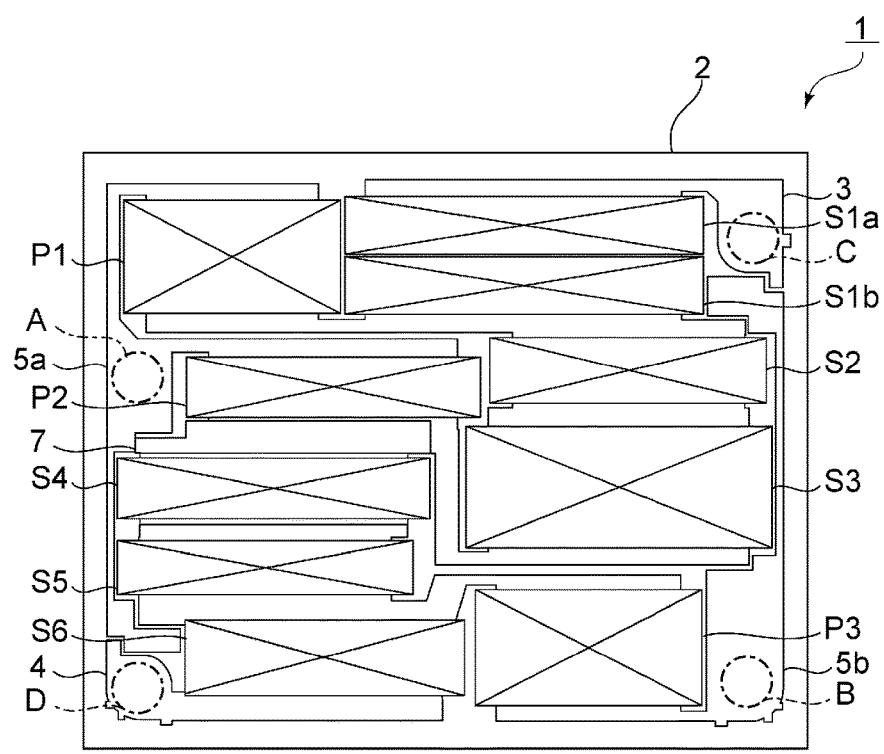
FIG. 2 is a schematic plan view that illustrates a state where an interlayer insulating layer is disposed on the first conductive layer illustrated in FIG. 1 in the first preferred embodiment of the present invention.
Figure 3:
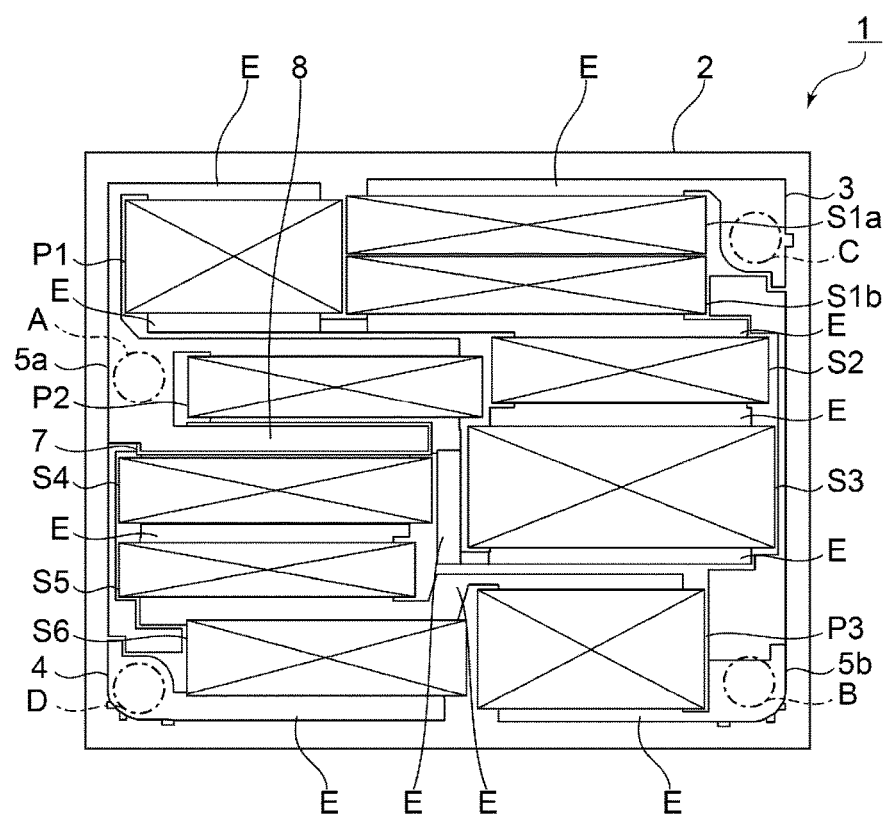
FIG. 3 is a schematic plan view that illustrates a state where a second conductive layer is disposed on the first conductive layer and interlayer insulating film in the first preferred embodiment of the present invention.

FIG. 1 is a schematic plan view that illustrates a state where a first conductive layer is disposed on a piezoelectric substrate according to a first preferred embodiment of the present invention. FIG. 2 is a schematic plan view that illustrates a state where an interlayer insulating layer is disposed on the first conductive layer illustrated in FIG. 1 according to the first preferred embodiment of the present invention. FIG. 3 is a schematic plan view that illustrates a state where a second conductive layer is disposed on the first conductive layer and interlayer insulating film according to the first preferred embodiment of the present invention.

A ladder filter 1 includes a piezoelectric substrate 2. The piezoelectric substrate 2 is made of a piezoelectric single crystal, such as lithium tantalate ($LiTaO_3$) or lithium niobate ($LiNbO_3$). The piezoelectric substrate 2 may be made of piezoelectric ceramics and may also have a configuration in which a piezoelectric single crystal thin film is disposed on a non-piezoelectric member carrier.

The piezoelectric substrate 2 is provided with a plurality of elastic wave resonators. The plurality of elastic wave resonators include series arm resonators S1a, S1b to S6 and parallel arm resonators P1 to P3 described below. The elastic wave resonators are depicted in schematic form in FIGS. 1 to 3.

The structure of each of the elastic wave resonators is described with reference to FIGS. 4A and 4B.

Figure 4A:
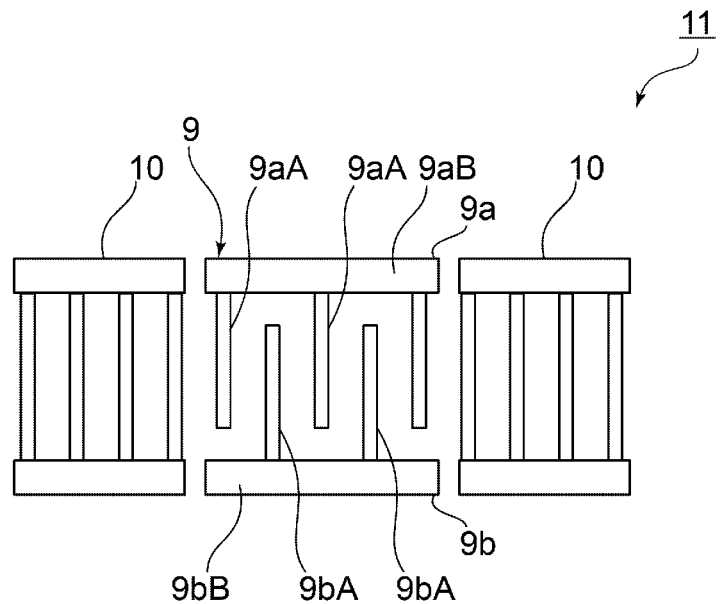
FIG. 4A is a schematic plan view that illustrates an elastic wave resonator.
Figure 4B:
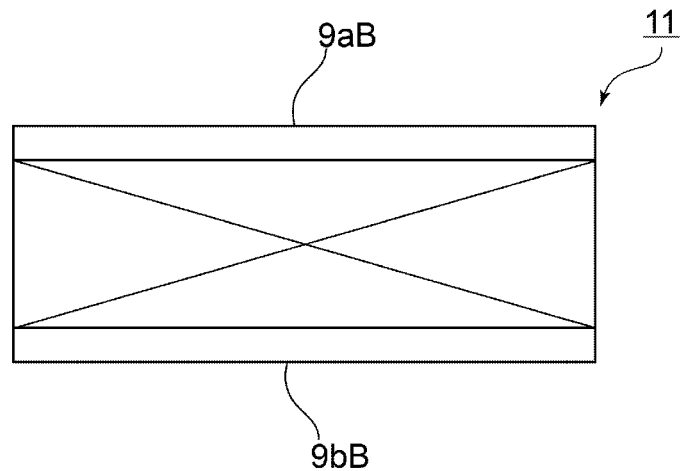
FIG. 4B is a schematic plan view for describing the schematic diagrams for the elastic wave resonators illustrated in FIGS. 1 to 3.

A first electrode 9a and a second electrode 9b to transmit and receive surface acoustic waves and defining a pair of comb-shaped electrodes illustrated in FIG. 4A are disposed on the piezoelectric substrate 2. The first electrode 9a includes a plurality of electrode fingers 9aA and a busbar 9aB to which first ends of the plurality of electrode fingers 9aA are connected commonly. The second electrode 9b includes a plurality of electrode fingers 9bA and a busbar 9bB to which the plurality of electrode fingers 9bA are connected commonly. The plurality of electrode fingers 9aA in the first electrode 9a and the plurality of electrode fingers 9bA in the second electrode 9b are interdigitated with each other. In this way, an interdigital transducer (IDT) electrode 9 is defined.

A reflector 10 is disposed on each of both sides of the IDT electrode 9 in a direction of propagation of surface acoustic waves. In this way, a one-port elastic wave resonator 11 is defined. The elastic wave resonator 11 is illustrated in schematic form in FIG. 4B. Each of the series arm resonators S1a, S1b to S6 and parallel arm resonators P1 to P3 illustrated in FIGS. 1 to 3 is depicted in schematic form in FIG. 4B.

Referring back to FIG. 1, an antenna terminal 3 being a first signal terminal, a transmission terminal 4 being a second signal terminal, ground terminals 5a and 5b, and the plurality of IDT electrodes are disposed on the piezoelectric substrate 2. The antenna terminal 3, the transmission terminal 4, the ground terminals 5a and 5b, and the plurality of IDT electrodes define a first conductive layer on the piezoelectric substrate 2. To form the antenna terminal 3, the transmission terminal 4, the ground terminals 5a and 5b, and the plurality of IDT electrodes, for example, a metal film made of aluminum or an aluminum-based alloy is formed by electron beam (EB) evaporation or sputtering. Then, the metal film is patterned in a series of photolithographic processes, including exposure, development, and etching, for example.

The series arm resonators S1a, S1b to S6 and parallel arm resonators P1 to P3 illustrated in FIG. 1 are preferably provided by forming the IDT electrodes on the piezoelectric substrate 2 in the above-described manner. The reflectors 10 illustrated in FIG. 4A are formed simultaneously with the formation of the IDT electrodes.

As illustrated in FIG. 2, an interlayer insulating film is disposed on the first conductive layer. To form the interlayer insulating film 7, for example, an insulating film is first formed over the surface in photolithographic processes. Then, a resist is applied as a mask on a portion where it is necessary to form the interlayer insulating film 7. Then, the insulating film is removed from an unnecessary portion by dry etching or wet etching. After that, the resist is removed. The interlayer insulating film 7 can be made of a material in which a resin is kneaded with a filler. The interlayer insulating film 7 may be made of any appropriate inorganic oxide, such as silicon dioxide ($SiO_2$) or zinc oxide (ZnO).

As illustrated in FIG. 3, a second conductive layer E is disposed on the first conductive layer and the interlayer insulating film 7. The second conductive layer E is disposed on a portion that corresponds to the busbars in the IDT electrodes, the antenna terminal 3, the transmission terminal 4, and the ground terminals 5a and 5b, and the like on the first conductive layer. To form the second conductive layer E, for example, a resist is first applied on the piezoelectric substrate 2. Then, the resist is patterned as a mask in a series of photolithographic processes, including exposure, development, and etching. Then, a metal film made of aluminum or an aluminum-based alloy is formed by electron beam (EB) evaporation or sputtering. After that, the resist is removed, and thus the second conductive layer E is able to be formed.

A thermally conductive member 8 described below possess electrical conductivity in the present preferred embodiment and is formed simultaneously with the formation of the second conductive layer E.

Next, the structure of the present preferred embodiment is described more concretely.

As illustrated in FIG. 1, the series arm resonators S1a, S1b to S6 are provided in the series arm connecting the antenna terminal 3 and the transmission terminal 4. The parallel arm resonator P1 is provided in a first parallel arm connecting the wiring connecting the series arm resonators S1b and S2 and the ground terminal 5a. The parallel arm resonator P2 is provided in a second parallel arm connecting the wiring connecting the series arm resonators S3 and S4 and the ground terminal 5a. The parallel arm resonator P3 is provided in a third parallel arm connecting the wiring connecting the series arm resonators S5 and S6 and the ground terminal 5b.

Bumps are provided in portions indicated by the dot-dash lines A to D in the antenna terminal 3, the transmission terminal 4, and the ground terminals 5a and 5b. The ladder filter 1 is implemented on a circuit board or the like with the bumps interposed therebetween.

Figure 5A:
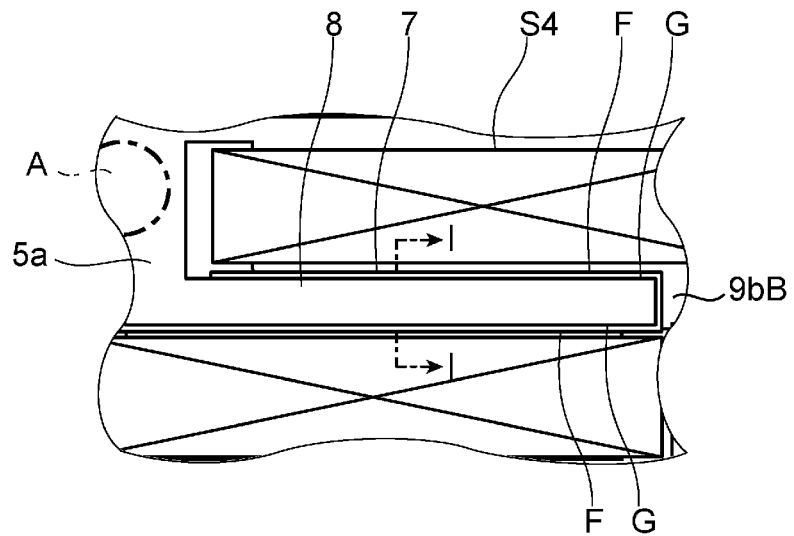
FIG. 5A is a partial cutaway plan view of a ladder filter according to the first preferred embodiment of the present invention.
Figure 5B:
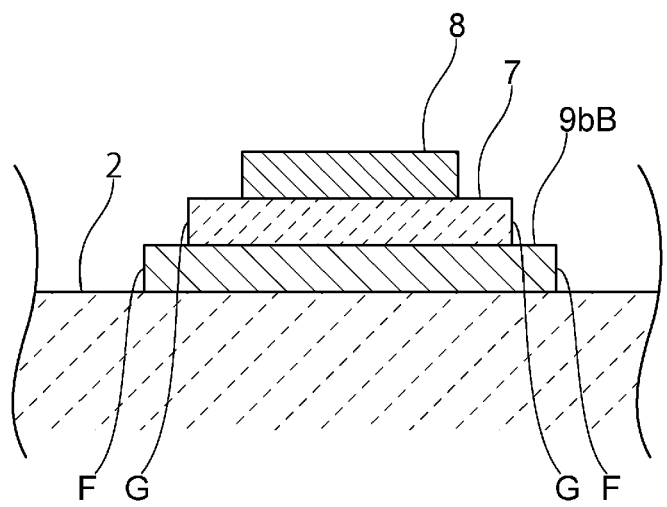
FIG. 5B is a partial cutaway cross-sectional view of the ladder filter taken along line I-I illustrated in FIG. 5A.

FIG. 5A is a partial cutaway plan view of the ladder filter according to the first preferred embodiment of the present invention, and FIG. 5B is a partial cutaway cross-sectional view of the ladder filter taken along line I-I illustrated in FIG. 5A.

FIGS. 5A and 5B are partial cutaway plan view and partial cutaway cross-sectional view of the series arm resonator S4 and its surroundings. Among the plurality of elastic wave resonators that are not directly connected to the ground terminals, the antenna terminal, or the transmission terminal, the series arm resonator S4 is an elastic wave resonator on which power concentrates because it is positioned in the center of the series arm and from which the largest amount of heat is generated.

The interlayer insulating film 7 is disposed on the busbar 9bB in the second electrode 9b in the series arm resonator S4. The interlayer insulating film 7 is in contact with the ground terminal 5a.

The interlayer insulating film 7 may be in contact with none of the antenna terminal 3, the transmission terminal 4, and the ground terminals 5a and 5b and may be in contact with at least one of the antenna terminal 3, the transmission terminal 4, and the ground terminals 5a and 5b.

The thermally conductive member 8, which possesses thermal conductivity higher than that of the interlayer insulating film 7, is disposed on the interlayer insulating film 7 and is in contact with the ground terminal 5a. The thermally conductive member 8 is made of any appropriate metal, alloy, or the like. When a direction parallel to the longitudinal direction of the busbar 9bB is the lengthwise direction of the thermally conductive member 8 and a direction perpendicular to the lengthwise direction of the thermally conductive member 8 is the width direction thereof, the dimension of the thermally conductive member 8 along the width direction is smaller than the dimension of the interlayer insulating film 7 along the width direction. Both side lines G, G of the thermally conductive member 8 in the width direction are positioned inside both side lines F, F of the interlayer insulating film 7 in the width direction. This configuration prevents a short circuit between the busbar 9bB in the second electrode 9b in the series arm resonator S4 and the thermally conductive member 8.

The thermally conductive member 8 may be made of any appropriate material that exhibits thermal conductivity higher than that of the interlayer insulating film 7, and the material may not possess electrical conductivity.

Characteristics of the present preferred embodiment are that it includes the thermally conductive member 8 on the busbar 9bB in the series arm resonator S4, which generates a large amount of heat, with the interlayer insulating film 7 interposed therebetween and that the thermally conductive member 8 is continuous with and in contact with the ground terminal 5a. The thermally conductive member 8 efficiently conveys heat generated in the series arm resonator S4 to the ground terminal 5a. The heat is dissipated from the ground terminal 5a to the outside through the bump. In this way, the thermally conductive member 8 provides a thermal dissipation path from the elastic wave resonator to the outside. In addition, the thermally conductive member 8 possesses thermal conductivity higher than that of the interlayer insulating film 7. Accordingly, the thermal dissipation of the ladder filter is effectively enhanced. Consequently, the electric power handling capability of the ladder filter is effectively improved.

If the thermally conductive member 8 does not possess electrical conductivity, the thermally conductive member 8 may be in contact with the antenna terminal and the transmission terminal. This configuration is able to effectively enhance the thermal dissipation.

In the present preferred embodiment, the interlayer insulating film 7 and the thermally conductive member 8 are disposed on the busbar in the series arm resonator S4, which generates the most heat. The interlayer insulating film 7 and the thermally conductive member 8 may be disposed on a busbar in another elastic wave resonator.

For example, in a branching device that includes a transmission filter and a reception filter, the transmission filter having a predetermined pass band is the ladder filter in the present preferred embodiment, the reception filter having a predetermined pass band different from the above predetermined pass band is a longitudinally coupled resonator-type filter, one end of the transmission filter and one end of the reception filter are connected to the antenna terminal, and thus a duplexer is defined.

In the case where the pass band of the transmission filter is lower than the pass band of the reception filter, among the series arm resonators in the ladder filter being the transmission filter, a series arm resonator having an anti-resonant frequency near a frequency at an attenuation pole nearest the pass band on a higher frequency side than the pass band generates a large amount of heat. Accordingly, to address the generation of heat in the series arm resonator, the thermally conductive member may be disposed on the busbar in the series arm resonator having the anti-resonant frequency near the frequency at the attenuation pole nearest the pass band on the higher frequency side outside the pass band, with the interlayer insulating film interposed therebetween. Preferably, the interlayer insulating film 7 may be disposed on the busbar in the series arm resonator having the anti-resonant frequency positioned nearest the frequency at the attenuation pole nearest the pass band on the higher frequency side outside the pass band.

In the case where the pass band of the transmission filter is higher than the pass band of the reception filter, among the parallel arm resonators in the ladder filter being the transmission filter, a parallel arm resonator having a resonant frequency near a frequency at an attenuation pole nearest the pass band on a lower frequency side than the pass band generates a large amount of heat. Accordingly, to address the generation of heat in that parallel arm resonator, the thermally conductive member may be disposed on the busbar in the parallel arm resonator having the resonant frequency near the frequency at the attenuation pole nearest the pass band on the lower frequency side outside the pass band, with the interlayer insulating film interposed therebetween. Preferably, the interlayer insulating film 7 may be disposed on the busbar in the parallel arm resonator having the resonant frequency positioned nearest the frequency at the attenuation pole nearest the pass band on the lower frequency side outside the pass band.

This configuration effectively enhances the thermal dissipation of the ladder filter.

The reception filter may be a ladder filter, in place of the longitudinally coupled resonator-type filter.

An elastic wave resonator that consumes a lot of power generates a large amount of heat. Accordingly, the interlayer insulating film may be disposed on a busbar in the elastic wave resonator with high power consumption. Preferably, the interlayer insulating film may be disposed on a busbar in an elastic wave resonator whose power consumption is not the lowest among the plurality of elastic wave resonators. In other words, the interlayer insulating film may preferably be disposed on a busbar in an elastic wave resonator with power consumption higher than that of at least one of the other elastic wave resonators. The interlayer insulating film may further preferably be disposed on a busbar in an elastic wave resonator with the highest power consumption. This configuration effectively enhances the thermal dissipation of the ladder filter.

Figure 6:
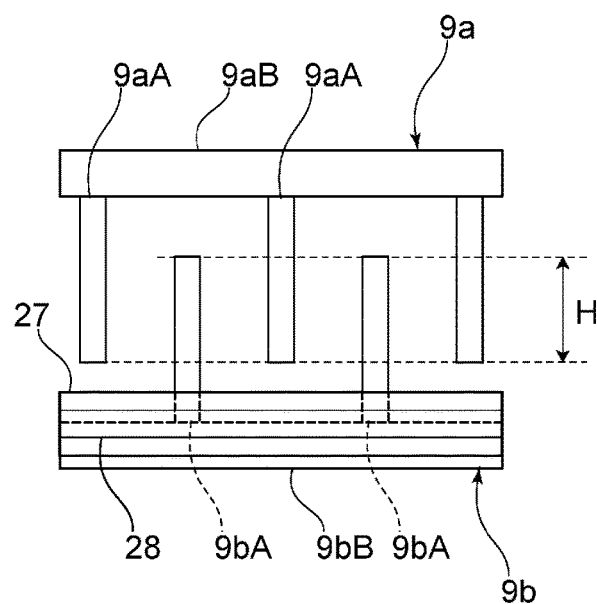
FIG. 6 is a schematic plan view that illustrates an elastic wave resonator in a first modification of the ladder filter according to the first preferred embodiment of the present invention.

In the present preferred embodiment, as illustrated in FIGS. 5A and 5B, the interlayer insulating film 7 is disposed on the busbar 9bB in the elastic wave resonator and does not reach an upper portion of the electrode fingers 9bA. As illustrated in a first modification in FIG. 6, an interlayer insulating film 27 disposed on the busbar 9bB may extend from the busbar 9bB to a region between an electrode finger overlap portion H and the busbar 9bB. When the interlayer insulating film 27 does not reach from the busbar 9bB to the electrode finger overlap portion H, even if the interlayer insulating film 27 reaches the upper portion of the electrode fingers 9bA, the effects on surface acoustic waves are small. A thermally conductive member 28 may also reach the upper portion of the electrode fingers 9bA with the interlayer insulating film 27 interposed therebetween. In this case, the thermally conductive member 28 is able to have an increased width, and the thermal dissipation is able to be further enhanced.

Next, the present inventor produced a non-limiting example of a ladder filter according to the first preferred embodiment of the present invention and a ladder filter in a first comparative example. The first comparative example is the same as the first preferred embodiment, except that it does not include the interlayer insulating film or thermally conductive member. The temperature increases in the first preferred embodiment and first comparative example were assessed by application of rated power.

It is observed that the ladder filter according to the first preferred embodiment achieves the advantage of suppressing a temperature increase by about 5% with respect to the first comparative example. Accordingly, it is ascertained that the present preferred embodiment effectively suppresses the temperature increase in the ladder filter.

Figure 7:
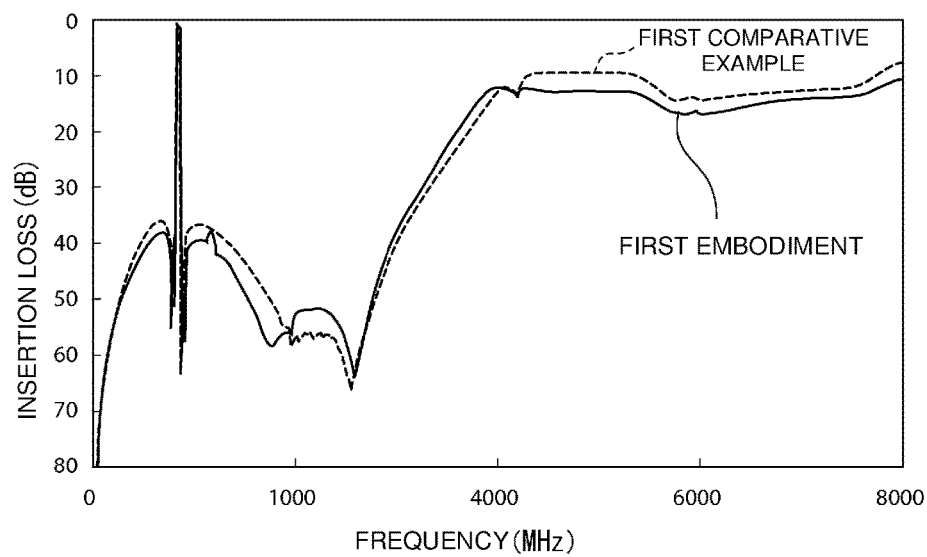
FIG. 7 illustrates attenuation frequency characteristics of the ladder filters according to the first preferred embodiment of the present invention and a first comparative example thereof.

FIG. 7 illustrates attenuation frequency characteristics of the ladder filters according to the first preferred embodiment and the first comparative example of the present invention. The solid line indicates the attenuation frequency characteristics in the first preferred embodiment, and the broken line indicates the attenuation frequency characteristics in the first comparative example. The ladder filters have a predetermined pass band whose frequency range is between 880 MHz and 915 MHz, for example.

As illustrated in FIG. 7, it is ascertained that the present preferred embodiment increases the attenuation on the higher frequency side more than the pass band. It is also ascertained that the present preferred embodiment increases the attenuation on the lower frequency side more than the pass band.

Figure 8:
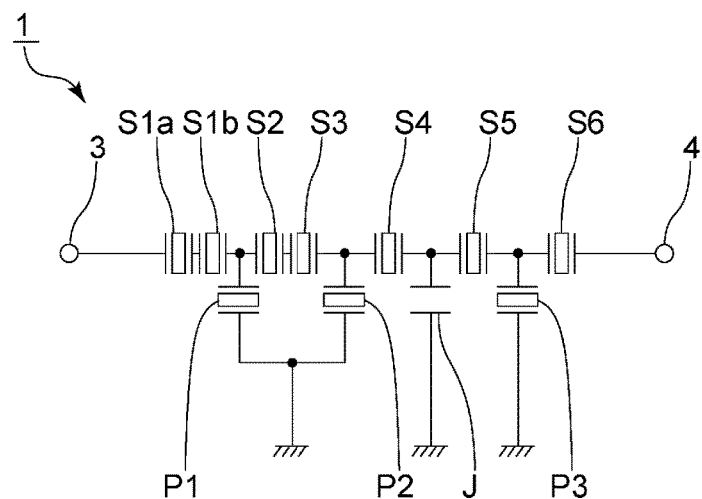
FIG. 8 is a circuit diagram that illustrates an equivalent circuit of the ladder filter according to the first preferred embodiment of the present invention.

FIG. 8 is a circuit diagram that illustrates an equivalent circuit of the ladder filter according to the first preferred embodiment of the present invention.

As in the present preferred embodiment, in the case where the thermally conductive member possesses electrical conductivity, not only the thermal dissipation is able to be more effectively enhanced, but the attenuation outside the pass band is able to be more increased. This is because the thermally conductive member and ground terminals with the interlayer insulating film interposed therebetween define a circuit equivalent to the circuit in which an electrostatic capacitance J is provided in parallel with the series arm resonators.

Specifically, as illustrated in FIG. 5A, the thermally conductive member 8 possessing electrical conductivity is disposed on the busbar 9bB in the series arm resonator S4 with the interlayer insulating film 7 interposed therebetween. The thermally conductive member 8 is electrically connected to the ground terminal 5a. Thus, as illustrated in FIG. 8, a capacitor that includes the electrostatic capacitance J between the series arm resonator S4 and the ground potential is provided.

Figure 9:
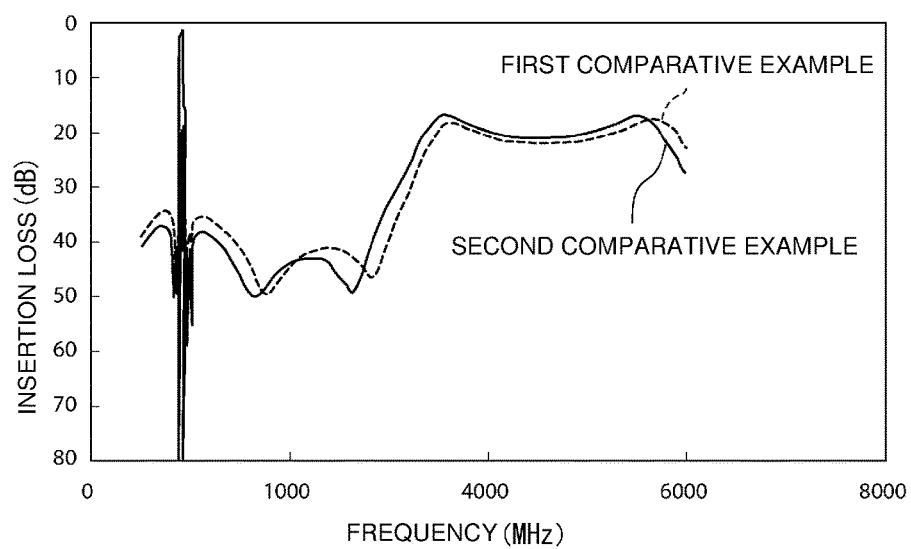
FIG. 9 illustrates attenuation frequency characteristics in the first comparative example and a second comparative example.

FIG. 9 illustrates attenuation frequency characteristics in the first comparative example and a second comparative example. The solid line indicates the attenuation frequency characteristics in the second comparative example, and the broken line indicates the attenuation frequency characteristics in the first comparative example. The second comparative example is a ladder filter in which an electrostatic capacitance is provided between the series arm and ground potential, as in the first comparative example, and the electrostatic capacitance in the parallel arm resonators is increased.

It is ascertained that the attenuation outside the pass band in the second comparative example is larger than that in the first comparative example. The second comparative example increases the electrostatic capacitance in the parallel arm resonators by increasing the area where the IDT electrodes are provided in the parallel arm resonators by 10%. Thus, the attenuation outside the pass band in the second comparative example is larger than that in the first comparative example.

As is clear from FIGS. 7 and 9, the attenuation frequency characteristics in the first preferred embodiment of the present invention are substantially the same as those in the second comparative example. However, the area where the IDT electrodes are formed in the parallel arm resonators in the first preferred embodiment of the present invention is smaller than that in the second comparative example by the order of 10%. Accordingly, it is ascertained that even when the area of the parallel arm resonators in the first preferred embodiment of the present invention is small, the attenuation outside pass band is able to be effectively increased. Consequently, it is ascertained that the ladder filter is able to be miniaturized.

In the present preferred embodiment, as illustrated in FIGS. 5A and 5B, and 8, the electrostatic capacitance J is provided by disposition of the interlayer insulating film 7 and thermally conductive member 8 on the busbar 9bB in the series arm resonator S4. The interlayer insulating film may be disposed on a busbar in another elastic wave resonator in which the area where the IDT electrodes are provided is small. Preferably, the interlayer insulating film may be disposed on a busbar in an elastic wave resonator in which the area where the IDT electrodes are provided is smaller than that in at least one of the other elastic wave resonators. Further preferably, the interlayer insulating film and thermally conductive member possessing electrical conductivity may be disposed on a busbar in an elastic wave resonator in which the area where the IDT electrodes are provided is the smallest. Because the area where the IDT electrodes are provided in that elastic wave resonator is small, the electrostatic capacitance is small. The attenuation outside the pass band is able to be effectively increased by providing the electrostatic capacitance originating from the interlayer insulating film and thermally conductive member possessing electrical conductivity to the elastic wave resonator having small electrostatic capacitance.

In the present preferred embodiment, the attenuation outside the pass band is able to be increased by providing the electrostatic capacitance connected from the series arm to the ground terminal, independently of the presence or absence of an extended inductor between the parallel arm resonator and the ground terminal. Accordingly, the ladder filter is able to be further miniaturized.

Figure 10A:
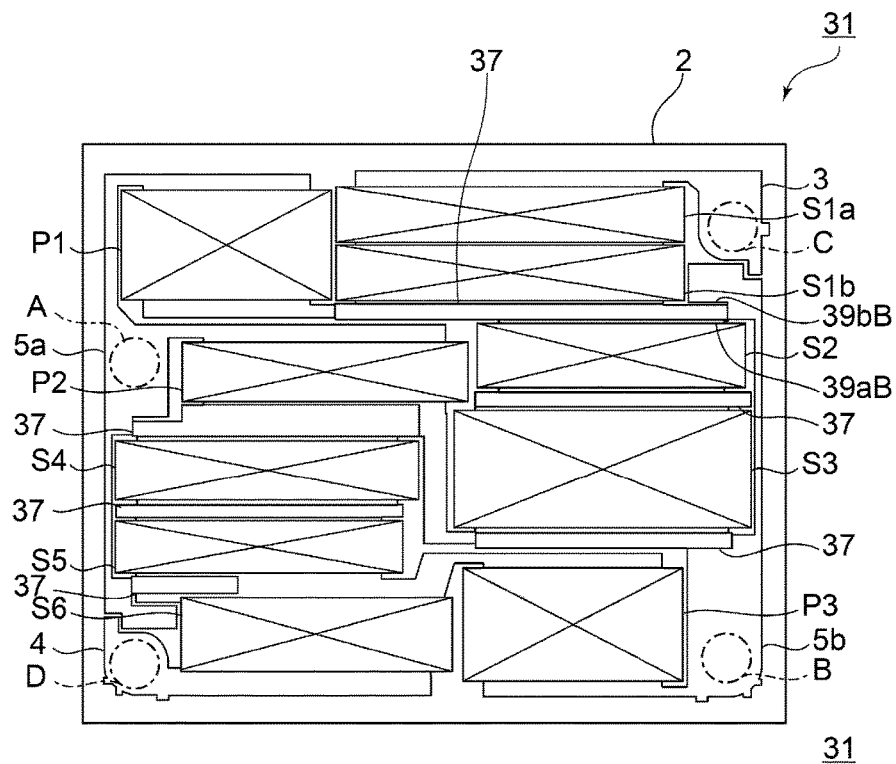
FIG. 10A is a schematic plan view that illustrates arrangement of a first conductive layer and an interlayer insulating film in a circuitry configuration on a piezoelectric substrate used in a ladder filter according to a second preferred embodiment of the present invention.
Figure 10B:
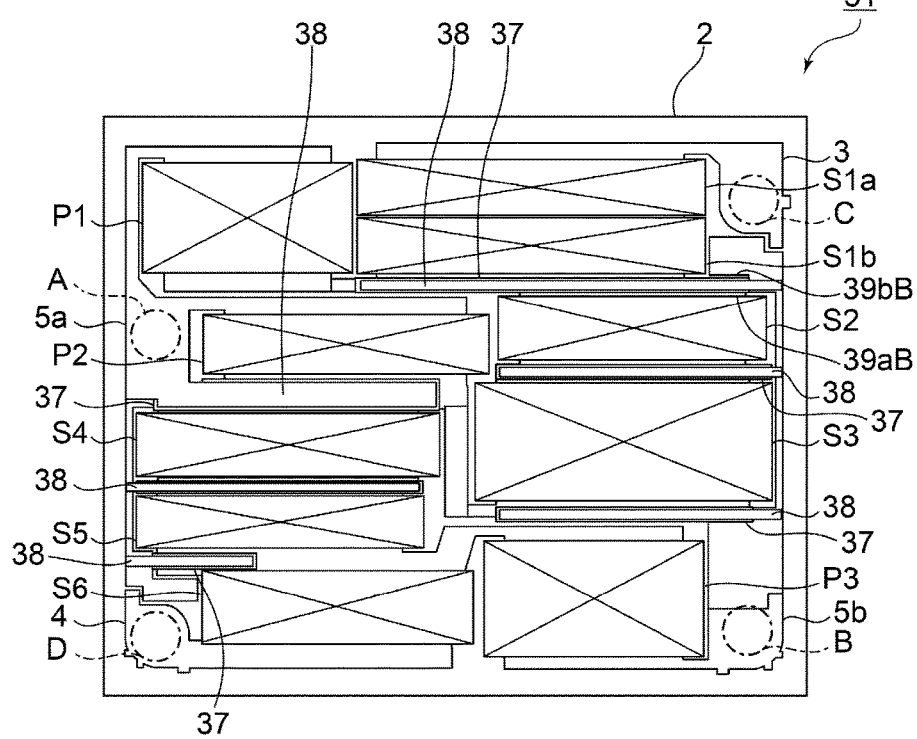
FIG. 10B is a schematic plan view that illustrates a state where a second conductive layer is disposed on the first conductive layer and interlayer insulating film in the second preferred embodiment of the present invention.

FIG. 10A is a schematic plan view that illustrates arrangement of a first conductive layer and an interlayer insulating film in a circuitry configuration on a piezoelectric substrate used in a ladder filter according to a second preferred embodiment of the present invention. FIG. 10B is a schematic plan view that illustrates a state where a second conductive layer is disposed on the first conductive layer and interlayer insulating film in the second preferred embodiment of the present invention.

An interlayer insulating film 37 and a thermally conductive member 38 in a ladder filter 31 are disposed on the busbars in the series arm resonators S1b to S6. In this way, the interlayer insulating film 37 and the thermally conductive member 38 may be disposed on the busbars in the plurality of elastic wave resonators. This configuration enables the plurality of elastic wave resonators to include a thermal dissipation path. Accordingly, the thermal dissipation of the ladder filter is able to be further enhanced.

The two adjacent series arm resonators S1b and S2 include first busbars 39bB and 39aB, respectively, which are electrically connected to each other and are connected to none of the antenna terminal 3, the transmission terminal 4, and the ground terminals 5a and 5b. The interlayer insulating film 37 and the thermally conductive member 38 are disposed so as to reach both the first busbar 39bB in the series arm resonator S1b and the first busbar 39aB in the series arm resonator S2. The first busbars 39bB and 39aB have commonality. Thus, the interlayer insulating film 37 and the thermally conductive member 38 may not be disposed on each of the busbars in the elastic wave resonators. Accordingly, the flexibility in designing the ladder filter is able to be increased. Consequently, the ladder filter is able to be miniaturized.

The interlayer insulating film 37 and the thermally conductive member 38 are also disposed on the busbar in the parallel arm resonator P2. Because the second electrode in the parallel arm resonator P2 is electrically connected to the ground terminal 5a, the thermal dissipation path is ensured, in addition to the existing ensured thermal dissipation, the thermal dissipation path for the parallel arm resonator P2 is able to be further ensured. This configuration is able to further enhance the thermal dissipation of the ladder filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A ladder filter comprising:
a piezoelectric substrate;
a first signal terminal, a second signal terminal, and a ground terminal disposed on the piezoelectric substrate; and
a plurality of interdigital transducer (IDT) electrodes disposed on the piezoelectric substrate, each of the plurality of IDT electrodes including a plurality of electrode fingers and a pair of busbars to which first ends of the plurality of electrode fingers are connected commonly; wherein
the plurality of IDT electrodes respectively include an electrode finger overlap portion of the plurality of electrode fingers in which the electrode fingers that are connected to one of the pair of busbars overlap the electrode fingers that are connected to the other one of the pair of busbars;
the plurality of IDT electrodes define a plurality of elastic wave resonators with a predetermined pass band, the plurality of elastic wave resonators include a plurality of series arm resonators and at least one parallel arm resonator, the plurality of series arm resonators are in a series arm connecting the first signal terminal and the second signal terminal, the at least one parallel arm resonator is in a respective parallel arm connecting the series arm and the ground terminal;
the ladder filter further comprising:

an interlayer insulating film disposed on a surface of at least one of the pair of busbars opposite to a side on which the piezoelectric substrate is disposed; and
a thermally conductive member made of a material possessing thermal conductivity higher than that of the interlayer insulating film and disposed on the interlayer insulating film; wherein
the thermally conductive member is in contact with at least one of the first signal terminal, the second signal terminal, and the ground terminal; and
the interlayer insulating film does not reach the electrode finger overlap portion of the plurality of electrode fingers.

2. The ladder filter according to claim 1, wherein the thermally conductive member is in contact with the ground terminal.

3. The ladder filter according to claim 2, wherein the thermally conductive member possesses electrical conductivity, and the thermally conductive member is in contact with only the ground terminal among the first signal terminal, the second signal terminal, and the ground terminal.

4. The ladder filter according to claim 3, wherein the busbars, the interlayer insulating film, and the thermally conductive member define a capacitor.

5. The ladder filter according to claim 1, wherein the thermally conductive member does not possess electrical conductivity.

6. The ladder filter according to claim 1, wherein
the plurality of elastic wave resonators include an elastic wave resonator including the busbar on which the interlayer insulating film is disposed and an elastic wave resonator including the busbar on which the interlayer insulating film is not disposed; and
power consumption of the elastic wave resonator including the busbar on which the interlayer insulating film is disposed is not a lowest among the plurality of elastic wave resonators.

7. The ladder filter according to claim 6, wherein an area where the IDT electrodes in the elastic wave resonator including the busbar on which the interlayer insulating film is disposed are located is not a largest among the plurality of elastic wave resonators.

8. The ladder filter according to claim 1, wherein the plurality of series arm resonators include the elastic wave resonator including the busbar on which the interlayer insulating film is disposed.

9. The ladder filter according to claim 1, wherein
the plurality of series arm resonators include a series arm resonator including the busbar on which the interlayer insulating film is disposed and a series arm resonator including the busbar on which the interlayer insulating film is not disposed; and
the series arm resonator including the busbar on which the interlayer insulating film is disposed has an anti-resonant frequency nearest a frequency at an attenuation pole nearest the predetermined pass band on a higher frequency side outside the predetermined pass band.

10. The ladder filter according to claim 1, wherein
the at least one parallel arm resonator includes a parallel arm resonator including the busbar on which the interlayer insulating film is disposed and a parallel arm resonator including the busbar on which the interlayer insulating film is not disposed; and
the parallel arm resonator including the busbar on which the interlayer insulating film is disposed has a resonant frequency nearest a frequency at an attenuation pole nearest the predetermined pass band on a lower frequency side outside the predetermined pass band.

11. The ladder filter according to claim 1, wherein among the plurality of elastic wave resonators, two adjacent elastic wave resonators include first busbars that are electrically connected to each other and that are not connected to the ground terminal, the interlayer insulating film is disposed so as to reach both the first busbars, and the thermally conductive member is disposed on the interlayer insulating film.

12. The ladder filter according to claim 1, wherein the interlayer insulating film reaches a region between the electrode finger overlap portion and the bulbar on which the interlayer insulating film is disposed.

13. The ladder filter according to claim 1, further comprising a reflector located on both sides of the plurality of interdigital transducer electrodes on the piezoelectric substrate.

14. The ladder filter according to claim 1, further comprising bumps provided on the piezoelectric substrate at locations of the first signal terminal, the second signal terminal and the ground terminal.

15. The ladder filter according to claim 1, wherein the thermally conductive member is made of one of a metal and an alloy.

16. A duplexer comprising the ladder filter according to claim 1.

17. The duplexer according to claim 16, further comprising an antenna terminal, a transmission filter defined by the ladder filter, a reception filter with a pass band different from the transmission filter, wherein the transmission filter and the reception filter are connected to the antenna terminal.

18. The duplexer according to claim 16, wherein the thermally conductive member is in contact with the ground terminal.

19. The duplexer according to claim 18, wherein the thermally conductive member possesses electrical conductivity, and the thermally conductive member is in contact with only the ground terminal among the first signal terminal, the second signal terminal, and the ground terminal.

20. The duplexer according to claim 19, wherein the busbars, the interlayer insulating film, and the thermally conductive member define a capacitor.

* * * * *